(12) United States Patent
Mochizuki et al.

(10) Patent No.: US 12,291,640 B2
(45) Date of Patent: May 6, 2025

(54) FLAME-RETARDANT POLYORGANOSILOXANE COMPOSITION, FLAME-RETARDANT CURED PRODUCT, AND OPTICAL MEMBER

(71) Applicant: MOMENTIVE PERFORMANCE MATERIALS JAPAN LLC, Tokyo (JP)

(72) Inventors: Kikuo Mochizuki, Tokyo (JP); Hidefumi Tagai, Tokyo (JP)

(73) Assignee: MOMENTIVE PERFORMANCE MATERIALS JAPAN LLC, Tokyo (JP)

( * ) Notice: Subject to any disclaimer, the term of this patent is extended or adjusted under 35 U.S.C. 154(b) by 770 days.

(21) Appl. No.: 17/118,940

(22) Filed: Dec. 11, 2020

(65) Prior Publication Data

US 2021/0102070 A1   Apr. 8, 2021

Related U.S. Application Data

(63) Continuation of application No. PCT/JP2019/023070, filed on Jun. 11, 2019.

(30) Foreign Application Priority Data

Jun. 12, 2018 (JP) ................. 2018-111812

(51) Int. Cl.
*C08L 83/04* (2006.01)
*C08L 83/06* (2006.01)
*G02B 1/04* (2006.01)
*H10H 20/854* (2025.01)

(52) U.S. Cl.
CPC ............ *C08L 83/06* (2013.01); *C08L 83/04* (2013.01); *G02B 1/041* (2013.01); *C08L 2201/02* (2013.01); *C08L 2205/025* (2013.01); *C08L 2205/03* (2013.01); *H10H 20/854* (2025.01)

(58) Field of Classification Search
CPC ......... C08G 77/12; C08G 77/20; C08L 83/04; H01L 23/296; B01J 23/04
See application file for complete search history.

(56) References Cited

U.S. PATENT DOCUMENTS

| | | | |
|---|---|---|---|
| 3,635,874 A | 1/1972 | Laur | |
| 3,652,488 A | 3/1972 | Harder | |
| 4,707,531 A | 11/1987 | Shirahata | |
| 4,978,705 A * | 12/1990 | Lamont | C08K 3/32 524/706 |
| 6,284,861 B1 * | 9/2001 | Takuman | C08L 83/04 556/408 |
| 11,702,510 B2 * | 7/2023 | Jang | C08G 77/20 528/31 |
| 2005/0006794 A1 * | 1/2005 | Kashiwagi | C08L 83/04 257/E33.059 |
| 2006/0264567 A1 | 11/2006 | Shiobara et al. | |
| 2006/0275617 A1 * | 12/2006 | Miyoshi | C08L 83/04 525/477 |
| 2012/0065343 A1 | 3/2012 | Bahadur et al. | |
| 2013/0065999 A1 | 3/2013 | Takanashi | |
| 2013/0161683 A1 | 6/2013 | Hamamoto et al. | |
| 2013/0296521 A1 | 11/2013 | Choi et al. | |
| 2014/0235806 A1 | 8/2014 | Miyamoto et al. | |
| 2015/0045487 A1 | 2/2015 | Takanashi | |
| 2015/0337189 A1 | 11/2015 | Takanashi et al. | |
| 2016/0251482 A1 | 9/2016 | Yamazaki et al. | |
| 2017/0247590 A1 * | 8/2017 | Zheng | C08G 77/08 |
| 2017/0283613 A1 | 10/2017 | Mochizuki | |
| 2017/0283614 A1 | 10/2017 | Mochizuki | |
| 2019/0225806 A1 | 7/2019 | Muramatsu et al. | |

FOREIGN PATENT DOCUMENTS

| | | |
|---|---|---|
| CN | 102414275 A | 4/2012 |
| CN | 103403097 A | 11/2013 |
| CN | 103814087 A | 5/2014 |
| CN | 105368064 A | 3/2016 |
| CN | 105713391 A | 6/2016 |

(Continued)

OTHER PUBLICATIONS

European Search Report on EP 19819858.2 mailed Feb. 8, 2022 (6 pages).
Chinese Office Action on CN Appl. Ser. No. 201980038877 dated Sep. 30, 2022 (14 pages).
Office Action issued in corresponding Chinese Patent Application No. 201980038877.0, dated Dec. 26, 2022 (13 pages).
Chinese Office Action for Chinese Application No. 201980038877.0 dated May 16, 2022.
European Search Report on EP Appl. Ser. No. 19819725.3 mailed Feb. 9, 2022 (10 pages).

(Continued)

*Primary Examiner* — Margaret G Moore
(74) *Attorney, Agent, or Firm* — Foley & Lardner LLP

(57) ABSTRACT

To provide a polyorganosiloxane composition whose cured product has uniform good flame retardancy and good physical properties with less discoloring, for example, yellowing, and which has excellent temporal stability when stored. A flame-retardant polyorganosiloxane composition contains: (A) straight-chain polyalkylsiloxane having two or more alkenyl groups in one molecule and having a 10,000 to 1,000,000 mPa·s viscosity (25° C.); (B) resinoid polyorganosiloxane containing a Q unit and having 1.5 or more alkenyl groups on average, mass % of the component (B) being 30 to 80 mass % of the total of the components (A), (B); (C) polyorganohydrogensiloxane having three or more Si—H, an amount of the component (C) being such that Si—H/(total of the alkenyl groups in the components (A), (B)) becomes 1.0 to 3.0 moles; and (D) a catalytic amount of a hydrosilylation reaction catalyst, wherein the total content of phosphorus and an alkali metal is 20 mass ppm or less.

13 Claims, No Drawings

(56) References Cited

FOREIGN PATENT DOCUMENTS

| | | | |
|---|---|---|---|
| CN | 107001803 A | 8/2017 | |
| CN | 107429062 A | 12/2017 | |
| EP | 332 785 | * 12/1987 | |
| EP | 3 235 873 | 10/2017 | |
| JP | H11-140319 A | 5/1999 | |
| JP | H11-140320 A1 | 5/1999 | |
| JP | 2006-117845 A1 | 5/2006 | |
| JP | 2008-291124 A1 | 12/2008 | |
| JP | 2009-185257 A | 8/2009 | |
| JP | 4697405 B2 | 6/2011 | |
| JP | 2013-129792 A | 7/2013 | |
| JP | 2014-034679 A1 | 2/2014 | |
| JP | 2014-040522 A | 3/2014 | |
| JP | 2016-155967 A | 9/2016 | |
| JP | 2017-525817 A1 | 9/2017 | |
| JP | 2017-218474 A | 12/2017 | |
| WO | WO-2012/050105 A1 | 4/2012 | |
| WO | WO-2014/104080 A1 | 7/2014 | |
| WO | WO-2016/098883 A1 | 6/2016 | |
| WO | WO-2016/098884 A1 | 6/2016 | |
| WO | WO-2018/055896 A1 | 3/2018 | |

OTHER PUBLICATIONS

Office Action issued in corresponding Chinese Patent Application No. 201980038866.2, dated Apr. 26, 2022.

US Non-Final Office Action on U.S. Appl. No. 17/118,975 dated Jun. 7, 2023 (7 pages).

US Non-Final Office Action on U.S. Appl. No. 17/118,975 dated Oct. 5, 2023 (8 pages).

US Final Office Action for U.S. Appl. No. 17/118,975 dated Mar. 22, 2024 (7 pages).

\* cited by examiner

FLAME-RETARDANT POLYORGANOSILOXANE COMPOSITION, FLAME-RETARDANT CURED PRODUCT, AND OPTICAL MEMBER

CROSS-REFERENCE TO RELATED APPLICATIONS

This application is a continuation of prior International Application No. PCT/JP2019/023070, filed Jun. 11, 2019 which is based upon and claims the benefit of priority from Japanese Patent Application No. 2018-111812, filed Jun. 12, 2018; the entire contents of all of which are incorporated herein by reference.

FIELD

The present invention relates to a flame-retardant polyorganosiloxane composition, a flame-retardant cured product, and an optical member, and in particular, relates to an addition reaction curing-type polyorganosiloxane composition from which a cured product excellent in flame retardancy is formed, a flame-retardant cured product produced through the curing of the polyorganosiloxane composition, and an optical member.

BACKGROUND

Polyorganosiloxane compositions that cure into silicone rubber have conventionally been well known, and because of their excellent properties such as weather resistance, heat resistance, electric insulation, hardness, mechanical strength, and elongation, they are widely used as potting materials, coating materials, molding materials of mold making, injection molding, and the like, covering materials, and so on in various fields such as electrical and electronic fields, optic and optoelectronics, sensors, and architectures. Among them, a polyorganosiloxane composition that cures through an addition reaction has found increasing applications in the aforesaid fields because it quickly cures when appropriately heated and releases no corrosive substance and the like when curing.

A conventional technique to impart flame retardancy to such a polyorganosiloxane composition is to add a platinum-based metal compound. However, to obtain sufficient flame retardancy, a large amount of the platinum-based metal compound has to be added, leading to a problem of poor transparency such as discoloring, for example, yellowing of its cured product. Further, from the viewpoint of material cost, it is desired to reduce the addition amount of the platinum-based metal compound as much as possible.

To improve flame retardancy, a method of compounding carbon black or titanium oxide (see, for example, U.S. Pat. Nos. 3,652,488 and 3,635,874) or a method of compounding a flame retardant other than the platinum-based compound, such as phosphoric ester or phosphite ester (see, for example, JP-A Hei 11-140320) has been implemented.

These methods, however, have drawbacks that they not only tend to degrade other physical properties but also discolor the composition and cannot produce a transparent cured product, and hence the use of the composition as optical materials such as a sealing material, a lens, and a cover of a light-emitting device is difficult and its flame retardancy degrades over time. The method described in JP-A Hei 11-140320 also has problems that the flame retardant easily separates since some types of base polymers do not have sufficient compatibility with the flame retardant, and the cured product tends to discolor, for example, yellow over time.

To solve these problems, there has been proposed a curable silicone composition that has, as polymer components containing alkenyl groups, not only straight-chain polyorganosiloxane but also resinoid polyorganosiloxane having a tetrafunctional siloxane unit and having a low alkoxy group content.

These compositions, however, sometimes vary in flame retardancy though their flame retardancy is good. Further, in a transparent material, only by reducing a ratio of the alkoxy group content, it is difficult to obtain stable flame retardancy.

Our studies on a cause of such variation in flame retardancy have led to the findings that impurities such as phosphorus and alkali metals in the composition degrade flame retardancy. Specifically, it has been found out that the alkali metals derived from a catalyst used in a synthesis process of the alkenyl group-containing polyorganosiloxanes, which are the polymer components, and the phosphorus derived from phosphoric acid used as a neutralizing agent remain in the composition to degrade flame retardancy. There is also a problem that a composition having a large residual amount of the aforesaid alkali metals and phosphorus tends to change (increase) in viscosity and is poor in storage stability.

Regarding a property improvement by removing impurities, it has been proposed that, in a curable composition having alkenyl group-containing polyorganosiloxane, polyorganohydrogensiloxane, and a platinum-based catalyst, the contents of sodium and potassium in the composition are regulated to a predetermined value or less, thereby improving the heat resistance of a cured product (see, for example, JP-A 2014-34679).

The composition described in JP-A 2014-34679, however, is intended to produce a gel-like cured product, and under present circumstances, it is not possible to obtain a cured product having high mechanical strength and good flame retardancy.

SUMMARY

This embodiment was made to solve these problems and has an object to provide a polyorganosiloxane composition from which a cured product having uniform good flame retardancy is obtained, whose cured product has good physical properties and undergoes less discoloring, for example, yellowing, and that is excellent in stability over time when stored.

A flame-retardant polyorganosiloxane composition of this embodiment includes:

(A) a straight-chain polyorganosiloxane represented by general formula:

[Chem. 1]

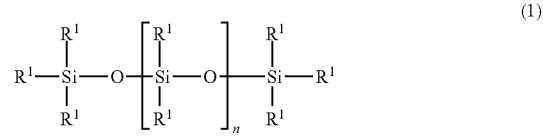

(1)

wherein $R^1$s represent an alkenyl group or a substituted or unsubstituted alkyl group, n represents the number of repeating units, and a sum of n and the number of end groups (n+2)

defines an average polymerization degree, the straight-chain polyorganosiloxane having two or more alkenyl groups bonded to silicon atoms on average in one molecule, and having a viscosity at 25° C. of 10,000 to 1,000,000 mPa·s;

(B) 30 to 80 mass % of a polyorganosiloxane having a resin structure to a total of the component (A) and the component (B), the polyorganosiloxane containing a tetrafunctional siloxane unit represented by a formula: $SiO_{4/2}$ and having 1.5 or more alkenyl groups bonded to silicon atoms on average in one molecule;

(C) polyorganohydrogensiloxane having three or more hydrogen atoms bonded to silicon atoms on average in one molecule, wherein an amount of the hydrogen atoms bonded to the silicon atoms in the component (C) becomes 1.0 to 3.0 mol to a total 1 mol of the alkenyl groups in the component (A) and the alkenyl groups in the component (B); and (D) a catalytic amount of a hydrosilylation reaction catalyst, wherein a total content of phosphorus and an alkali metal is 20 mass ppm or less.

A flame-retardant cured product of this embodiment is produced through curing of the flame-retardant polyorganosiloxane composition of this embodiment, wherein a rating of UL-94 flame retardancy of a specimen with a 6 mm thickness or less of the flame-retardant cured product is V-1 or V-0. Further, a flame-retardant cured product of this embodiment is produced through curing of the flame-retardant polyorganosiloxane composition of this embodiment n, wherein a rating of UL-94 flame retardancy of a specimen with a 6 mm thickness or less of the flame-retardant cured product is 5 VB or 5 VA. Further, a flame-retardant cured product of this embodiment is produced through curing of the flame-retardant polyorganosiloxane composition of this embodiment, wherein a rating of a specimen with a 6 mm thickness or less of the flame-retardant cured product in a UL-746C ultraviolet exposure and water immersion test is F1.

An optical member of this embodiment is produced through curing of the flame-retardant polyorganosiloxane composition of this embodiment.

Note that in the following description, "an alkenyl group bonded to a silicon atom "may be referred to simply as "an alkenyl group". Further, "a hydrogen atom bonded to silicon atoms" may be referred to simply as "Si—H". Further, "an alkoxy group bonded to silicon atoms" may be referred to simply as "an alkoxy group".

In the specification, "viscosity" refers to a viscosity that is measured at 25° C. using a rotational viscometer in conformity with JIS K6249.

According to the flame-retardant polyorganosiloxane composition of this embodiment, it is possible to obtain a cured product having good transparency and mechanical properties and excellent flame retardancy. Further, the cured product has less variation in flame retardancy and is excellent in stability. Further, the composition is less likely to change in viscosity over time and thus has good storage stability.

DETAILED DESCRIPTION

Hereinafter, embodiments of the present invent will be described.

Flame-Retardant Polyorganosiloxane Composition

A flame-retardant polyorganosiloxane composition of the embodiment of this embodiment includes:

(A) a straight-chain polyorganosiloxane represented by General Formula (1) above, having two or more alkenyl groups on average in one molecule, and having a viscosity of 10,000 to 1,000,000 mPa·s at 25° C.;

(B) polyorganosiloxane with a resin structure that contains a tetrafunctional siloxane unit represented by Formula: $SiO_{4/2}$ and contains 1.5 or more alkenyl groups on average in one molecule, mass % of the component (B) being 30 to 80 mass % of the total of the component (A) and the component (B);

(C) polyorganohydrogensiloxane having three or more Si—H on average in one molecule, an amount of the component (C) being such that a ratio of Si—H in the component (C) becomes 1.0 to 3.0 moles to the total 1 mole of the alkenyl groups in the component (A) and the alkenyl groups in the component (B); and (D) a catalytic amount of a hydrosilylation reaction catalyst, wherein the total content of phosphorus and alkali metals is 20 mass ppm or less.

The components (A) to (D) will be described below.

Component (A)

The component (A) is a component that is to be a base polymer of the flame-retardant polyorganosiloxane composition of this embodiment together with the component (B) to be described later. The component (A) is straight-chain polyorganosiloxane having two or more alkenyl groups on average in one molecule and having a viscosity of 10,000 to 1,000,000 mPa·s (10 to 1,000 Pa·s) at 25° C., and represented by General Formula (1).

[Chem. 2]

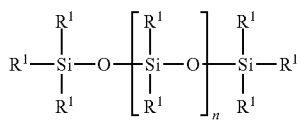

(1)

In Formula (1), $R^1$'s represent an alkenyl group or a substituted or unsubstituted alkyl group.

Examples of the alkenyl group include those with a carbon number of 2 to 8, more preferably 2 to 4, such as a vinyl group, an allyl group, a butenyl group, a pentenyl group, a hexenyl group, and a heptenyl group. The alkenyl group is especially preferably a vinyl group. The alkenyl groups may be bonded to a silicon atom at either the end of a chain or the middle of the chain other than the end, or may be bonded to silicon atoms at both of ends and middle of the chain.

Examples of the unsubstituted alkyl group include alkyl groups with a carbon number of 1 to 10, such as a methyl group, an ethyl group, a propyl group, a butyl group, a pentyl group, a hexyl group, a cyclohexyl group, and a heptyl group. Examples of the substituted alkyl group include halogenated alkyl groups such as a chloromethyl group, a 3-chloropropyl group, and a 3,3,3-trifluoropropyl group. The substituted or unsubstituted alkyl group is preferably a methyl group.

The viscosity of the component (A) at 25° C. is 10,000 to 1,000,000 mPa·s. The viscosity of the component (A) is preferably 10,000 to 700,000 mPa·s, more preferably 50,000 to 500,000 mP·s, and especially preferably 60,000 to 200,000 mPa·s. The component (A) whose viscosity is within the range of 10,000 to 1,000,000 mPa·s imparts good workability to the obtained composition and also imparts good mechanical properties to a cured product produced from the composition.

In Formula (1) above, n represents the number of repeating units of the polymerization, and (n+2) which is the sum of n and the number 2 of the end groups represents an average polymerization degree. n is adjusted such that the component (A) has the aforesaid viscosity (10,000 to 1,000,000 mPa·s). Specifically, (n+2) is preferably not less than 400 nor more than 1500.

Specific examples of the component (A) include a both ends trimethylsiloxy group-terminated dimethylsiloxane/methylvinylsiloxane copolymer, both ends dimethylvinylsiloxy group-terminated dimethylpolysiloxane, a both ends dimethylvinylsiloxy group-terminated dimethylsiloxane/methylvinylsiloxane copolymer, and both ends trivinylsiloxy group-terminated dimethylpolysiloxane.

These polymers or copolymers can each be used alone or two kinds or more of these can be used in combination. The use of any of these polymers or copolymers makes it possible to obtain a cured product excellent in mechanical properties such as tensile strength and elongation.

From the viewpoint of preventing variation in flame retardancy, the straight-chain polyorganosiloxane being the component (A) is preferably produced through polymerization using a thermally decomposable polymerization catalyst that is decomposed by heating and does not leave residues such as alkali metals. Specific examples of the thermally decomposable polymerization catalyst include tetramethylammonium hydroxide, tetraethylammonium hydroxide, tetrapropylammonium hydroxide, tetrabutylammonium hydroxide, and tetraalkylammonium silanolate which is silanolate of any of these. In particular, tetramethylammonium silanolate is preferably used.

The thermally decomposable polymerization catalyst is decomposed by heating in a synthesis process of the component (A) and remains little in the component (A). For example, the use of the tetramethylammonium silanolate as the thermally decomposable polymerization catalyst results in the production of trimethylamine as a decomposition product. Having a low boiling point, the trimethylamine can be easily removed. Incidentally, the trimethylamine can be analyzed by gas chromatography.

(A) The straight-chain polyorganosiloxane synthesized using the aforesaid thermally decomposable polymerization catalyst contains substantially no alkali metals such as sodium (Na), potassium (K), and cesium (Cs). Here, "contains substantially no" means that the content is equal to or less than detection sensitivity. The content of Cs can be measured by high-frequency inductively coupled plasma emission spectrometry (ICP-AES) or high-frequency inductively coupled plasma mass spectrometry (ICP-MS). The contents of K and Na can be measured by atomic absorption spectrometry (AAS). In the aforesaid measuring methods, the limit of Cs detection sensitivity is approximately 0.1 mass ppb in ICP-MS, and the limit of K and Na detection sensitivity is approximately 0.4 mass ppm.

In the case where the component (A) is polyorganosiloxane synthesized using the aforesaid thermally decomposable polymerization catalyst, the catalyst thermally decomposes to volatilize and does not remain in the component (A), so that the component (A) contains substantially no alkali metals, making it possible to obtain stable and high flame retardancy.

Component (B)

The component (B) is polyorganosiloxane having a resin structure (three-dimensional network structure) that contains a tetrafunctional siloxane unit represented by a formula: $SiO_{4/2}$ (hereinafter, referred to as a Q unit) and has 1.5 or more alkenyl groups on average in one molecule. Hereinafter, "having a resin structure" will be also referred to as "resinoid".

By using, as the component (B), the resinoid polyorganosiloxane containing the Q unit and having 1.5 or more alkenyl groups on average in one molecule, it is possible to obtain a highly flame-retardant composition. If the number of the alkenyl groups (in one molecule) of the resinoid polyorganosiloxane used is less than 1.5 on average, the obtained composition has poor flame retardancy, and a composition whose cured product has UL-94 flame retardancy evaluated as V-1 and V-0 cannot be obtained. The range of the number of the alkenyl groups in one molecule is preferably 2 or more on average, and particularly preferably 2.3 or more on average.

From the viewpoint of stable good flame retardancy, the resinoid polyorganosiloxane being the component (B) is preferably polyorganosiloxane that has one or more substituted or unsubstituted alkyl group bonded to silicon atoms in one molecule and has 0 or more alkoxy groups bonded to silicon atoms in one molecule. A molar ratio of the alkoxy group to the substituted or unsubstituted alkyl group (the number of moles of the alkoxy group/the number of moles of the substituted or unsubstituted alkyl group, hereinafter also referred to as alkoxy group/alkyl group) is preferably 0.030 or less.

Note that the aforesaid resinoid polyorganosiloxane having 0 or more alkoxy groups in one molecule also includes polyorganosiloxane that contains 0 alkoxy groups and in which the value of alkoxy group/alkyl group is 0.

It is possible to easily find the value of alkoxy group/alkyl group in the resinoid polyorganosiloxane being the component (B) by measuring the contents (the numbers of moles) of the alkoxy group and the alkyl group by nuclear magnetic resonance spectrometry (NMR) or the like.

The value of alkoxy group/alkyl group is more preferably 0.020 or less. The use of the resinoid polyorganosiloxane whose alkoxy group/alkyl group is 0.020 or less makes it possible to obtain a composition having good flame retardancy even if the later-described component (C) is straight-chained.

The resinoid polyorganosiloxane being the component (B) is preferably polyorganosiloxane containing a monofunctional siloxane unit represented by Formula: $R^1_3SiO_{1/2}$, a bifunctional siloxane unit represented by Formula: $R^1_2SiO_{2/2}$, and a tetrafunctional siloxane unit (Q unit) represented by Formula: $SiO_{4/2}$, and having 1.5 or more alkenyl groups on average in one molecule.

In the aforesaid unit formulas, $R^1$s represent the same as in the formula (1) above. That is, $R^1$s each independently represent an alkenyl group or a substituted or unsubstituted alkyl group. Out of the plurality of $R^1$s present in one molecule of the resinoid polyorganosiloxane, 1.5 $R^1$s on average are the alkenyl groups.

Further, the resinoid polyorganosiloxane being the component (B) can contain a unit represented by a formula $(R^OC_{1/2})$, that is, an alkoxy group represented by $-OR^O$ bonded to the silicon atoms. Here, $R^O$ represents an unsubstituted alkyl group, for example, an alkyl group with a carbon number of 1 to 3. The unsubstituted alkyl group is preferably a methyl group or an ethyl group. Hereinafter, the $-OR^O$ group bonded to the silicon atoms will also be referred to simply as a "$-OR^O$ group" unless otherwise mentioned.

Examples of (B) the resinoid polyorganosiloxane include:

a copolymer whose siloxane units are a monofunctional siloxane unit (hereinafter, also referred to as an $R^2_3SiO_{1/2}$ unit) represented by Formula: $R^2_3SiO_{1/2}$ ($R^2$ is an unsubstituted alkyl group, and the plurality of $R^2$s may be different. The same applies to the below), a monofunctional siloxane unit (hereinafter, also referred to as an $R^2_2R^3SiO_{1/2}$ unit) represented by Formula: $R^2_2R^3SiO_{1/2}$ ($R^3$s represent an alkenyl group. The same applies to the below), a bifunctional siloxane unit (hereinafter, also referred to as an $R^2_2SiO_{2/2}$ unit) represented by Formula: $R^2_2SiO_{2/2}$, and a tetrafunctional siloxane unit (Q unit) represented by Formula: $SiO_{4/2}$;

a copolymer whose siloxane units are an $R^2_3SiO_{1/2}$ unit, an $R^2_2R^3SiO_{1/2}$ unit, and a Q unit; and a copolymer whose siloxane units are an $R^2_2R^3SiO_{1/2}$ unit, an $R^2_2SiO_{2/2}$ unit, and a Q unit. One kind out of these copolymers can be used alone, or two kinds or more of these can be used in combination.

Among the aforesaid copolymers, the copolymer whose siloxane units are the $R^2_3SiO_{1/2}$ unit, the $R^2_2R^3SiO_{1/2}$ unit, and the Q unit is preferable. From the viewpoint of flame retardancy and so on, the smaller the number of the —OR$^0$ groups that the copolymer has, the more preferable, and a copolymer having no —OR$^0$ group is especially preferable.

More specifically, a copolymer whose siloxane units are a monofunctional siloxane unit (hereinafter, referred to as an $M^{vi}$ unit) represented by Formula: $(CH_3)_2(CH_2=CH)SiO_{1/2}$, a monofunctional siloxane unit (hereinafter, referred to as an M unit) represented by Formula: $(CH_3)_3SiO_{1/2}$, and a tetrafunctional siloxane unit (Q unit) represented by Formula $SiO_{4/2}$ is preferable. Further, a copolymer composed only of such siloxane units without having an alkoxy group is especially preferable.

Generally, the resinoid polyorganosiloxane can be obtained by adding water to chlorosilane and alkoxysilane to hydrolyze them. To obtain (B) the resinodid polyorganosiloxane to be compounded in the composition of this embodiment, it is preferable to cause a hydrolysis reaction while adjusting a content ratio of the alkoxy groups (methoxy groups, ethoxy groups, or the like) to a certain content or less.

A method of adjusting the content ratio of the alkoxy group to the certain content ratio or less is not particularly limited, and examples of the method include controlling the reaction temperature, time, or the like of the hydrolysis, performing extraction and removal using a water-soluble solvent such as alcohol or acetone, and the like. The resinoid polyorganosiloxane having a low content ratio of the alkoxy groups can be obtained, for example, by performing the following steps (1) to (3) in sequence.

(1) A step of hydrolyzing at least three kinds of silicon compounds selected from formulas: $R^1_3SiW$, $R^1_2SiW_2$, and $SiW_4$ with a mixed solution of acetone and water.

(2) A step of removing acid and acetone by water washing after the step (1)

(3) A step of adding an alkali and heating after the step (2)

In the silicon compounds used as starting materials in the step (1), $R^1$s each independently represent an alkenyl group or a substituted or unsubstituted alkyl group, and examples thereof are the same groups as in the Formula (1). Further, W's each independently represent a chlorine atom, an alkoxy group, or a hydroxyl group. Examples of such silicon compounds include tetraethoxysilane, chlorodimethylvinylsilane, chlorotrimethylsilane, and dichlorodimethylsilane. Three or more kinds among those silicon compounds are selected to be used.

As at least one kind of the three kinds of silicon compounds used as the starting materials, a silicon compound having one or more alkenyl group as $R^1$ is used. Further, it is preferable to use, as at least one kind of silicon compound, a silicon compound having one or more chlorine atoms as Ws.

The mixing ratio between acetone and water is preferably in a range of acetone:water of 1:1 to 1:4 (mass ratio). The hydrolysis can be performed by a publicly-known method. Further, in the step (2), the water washing method is not particularly limited, and a publicly-known method can be used.

Examples of the alkali which is added in the Step (3) to the solution obtained in the Step (2) include potassium hydroxide and cesium hydroxide. Such an alkali is added by a known method, followed by heating for dehydration, and thereafter, the resultant is neutralized with phosphoric acid or the like, whereby the resinoid polyorganosiloxane is obtained.

To impart uniform and stable good flame retardancy to the cured product, in the composition of this embodiment, (B) the resinoid polyorganosiloxane obtained by the above method is preferably one in which a ratio of the total content of phosphorus (P) and alkali metals is 30 mass ppm or less of the component (B). Further, a content ratio of the phosphorus in the component (B) to the component (B) is preferably 25 mass ppm or less. Further, a content ratio of potassium in the component (B) to the component (B) is preferably 2 mass ppm or less.

Examples of the alkali metals include sodium (Na), potassium (K), and cesium (Cs) as described above.

The contents of P and Cs in the component (B) can be measured by high-frequency inductively coupled plasma emission spectrometry (ICP-AES). As for Cs, high-frequency inductively coupled plasma mass spectrometry (ICP-MS) higher in sensitivity can also be used. The contents of K and Na can be measured by atomic absorption spectrometry (AAS).

The content ratio of the phosphorus in the component (B) is more preferably 15 mass ppm or less, and most preferably, it contains substantially no phosphorus (less than 10 ppm). Note that, as is the case with the aforesaid alkali metals, "contains substantially no" means that the content is on the same level as detection sensitivity or lower. The limit of P detection sensitivity of the aforesaid measuring method is approximately 10 mass ppm. Further, the content ratio of the potassium in the component (B) is more preferably 1 mass ppm or less, and most preferably, it contains substantially no potassium (less than 0.4 ppm). The total content of the phosphorus and the alkali metals in the component (B) is more preferably 20 mass ppm or less, and most preferably, it contains substantially no alkali metals (less than 10 ppm). Note that the limit of the phosphorus detection sensitivity, that is, 10 ppm is considered as the limit of the sensitivity in detecting the total amount of the phosphorus and the alkali metals since the limit of alkali metal detection sensitivity is far smaller than the limit of the phosphorus detection sensitivity.

To adjust the contents of the phosphorus and the alkali metals in the component (B) to the aforesaid ranges, P and the alkali metals such as Na, K, and Cs are removed by a method of water-washing the component (B), a method of treating the component (B) with an ion exchange resin, a method of treating the component (B) with an adsorbent, or the like. Incidentally, as the adsorbent, usable is a solid basic adsorbent such as an aluminum silicate powder, a silica powder, or a magnesium silicate powder.

A mass average molecular weight Mw of the resinoid polyorganosiloxane being the component (B) is preferably within a range of 1,500 to 10,000, and more preferably within a range of 2,200 to 8,000. Note that Mw is a polystyrene-equivalent value found by gel permeation chromatography (hereinafter, referred to as GPC). If Mw of (B) the resinoid polyorganosiloxane is less than 1,500, it may not be possible to stably obtain a cured product having sufficient mechanical strength. If Mw is over 10,000, the composition of this embodiment becomes high in viscosity to lose flowability and thus may be poor in moldability.

The resinoid polyorganosiloxane being the component (B) is to be the polymer component of the composition of this embodiment together with the straight-chain polyorganosiloxane being the component (A). A compounding ratio of (B) the resinoid polyorganosiloxane and (A) the straight-chain polyorganosiloxane is set such that a ratio of the component (B) is 30 to 80 mass % and a ratio of the component (A) is 70 to 20 mass % to the total (100 mass %) of the component (A) and the component (B). A composition in which the compounding ratio of the component (B) is less than 30 mass % cannot have good flame retardancy and mechanical strength. A composition in which the compounding ratio of the component (B) is over 80 mass % is high in viscosity and poor in workability. The compounding ratio of the component (B) to the total of the component (A) and the component (B) is more preferably 35 to 70 mass %, and especially preferably 37 to 65 mass %.

Component (C)

The component (C) is polyorganohydrogensiloxane having three or more hydrogen atoms bonded to silicon atoms (Si—H) on average in one molecule. The polyorganohydrogensiloxane being the component (C) acts as a cross-linking agent with its Si—H reacting with the alkenyl groups of the above-described component (A) and component (B). A molecular structure of the component (C) is not limited, and for example, the component (C) may be any of various kinds of polyorganohydrogensiloxanes such as straight-chained, cyclic, branched, and three-dimensional network ones. As the component (C), one kind of these various kinds of polyorganohydrogensiloxanes can be used alone, or two kinds or more of these can be used in combination.

From the viewpoint of the easy control of viscosity and an Si—H amount, the straight-chain polyorganohydrogensiloxane is preferable. Further, from the viewpoint of imparting high crosslink density to the cured product and thereby imparting high hardness to the cured product, one with the three-dimensional network structure is preferably used as the component (C).

In the polyorganohydrogensiloxane being the component (C), an average polymerization degree corresponds to the number of the silicon atoms in one molecule and is also the number of siloxane units present in one molecule. The average polymerization degree of the component (C) is preferably 10 or more. The average polymerization degree of the component (C) is more preferably 10 to 250, and especially preferably 30 to 200. Further, the content of Si—H per unit mass of the component (C) is preferably 5.0 mmol/g or more, and especially preferably in a range of 5.5 to 13.0 mmol/g.

In the case where the polyorganohydrogensiloxane being the component (C) is straight-chained, Si—H may be present only at either the end of the chain or the middle of the chain except the ends or may be present at both of these. Straight-chain polyorganohydrogensiloxane having Si—H at the middle of the chain is preferable since it enables to appropriately adjust the hardness of the cured product.

More specifically, the straight-chain polyorganohydrogensiloxane as the component (C) is preferably straight-chain polyorganohydrogensiloxane represented by Molecular Formula: $(R^4{}_3SiO_{1/2})(R^4HSiO_{2/2})_x(R^4{}_2SiO_{2/2})_y(R^4{}_3SiO_{1/2})$, or by Molecular Formula: $(R^4{}_2HSiO_{1/2})(R^4HSiO_{2/2})_x(R^4{}_2SiO_{2/2})_y(R^4{}_2HSiO_{1/2})$.

Here, $R^4$s each independently represent a substituted or unsubstituted monovalent hydrocarbon group except an alkenyl group. Examples of $R^4$ include: alkyl groups with a carbon number of 1 to 10 such as a methyl group, an ethyl group, a propyl group, a butyl group, a pentyl group, a hexyl group, a cyclohexyl group, and a heptyl group; and halogenated alkyl groups such as a chloromethyl group, a 3-chloropropyl group, and a 3,3,3-trifluoropropyl group. $R^4$ is preferably a methyl group.

In the aforesaid formulas, x and y are both positive integers, and relations of $8 \leq x+y \leq 200$ and $0.4 \leq x/(x+y) \leq 0.8$ preferably hold. Here, (x+y) represents the number of the siloxane units at the middle of the chain. Note that in this polyorganohydrogensiloxane, the average polymerization degree which is the number of the silicon atoms in one molecule is (x+y+2). (x+y) is preferably within a range of not less than 30 nor more than 200.

Further, as the component (C), resinoid polyorganohydrogensiloxane having an $R^4{}_2HSiO_{1/2}$ unit ($R^4$s each independently represent a substituted or unsubstituted monovalent hydrocarbon group except an alkenyl group. Specific examples are the same as those listed above.) and a Q unit can be used since it has viscosity appropriate for easy handleability and imparts high hardness to the cured product.

More specific examples of the above-described resinoid polyorganohydrogensiloxane include polyorganohydrogensiloxane having at least a $(CH_3)_2HSiO_{1/2}$ unit (hereinafter, referred to as an $M^H$ unit) and a $SiO_{4/2}$ unit (Q unit). This polyorganohydrogensiloxane can further have a $(CH_3)_3SiO_{1/2}$ unit (hereinafter, referred to as an M unit) and/or a $CH_3SiO_{3/2}$ unit (hereinafter, referred as a T unit).

As for a ratio of the $M^H$ unit and the Q unit, a ratio of the $M^H$ unit to one mole of the Q unit is preferably 1.5 to 2.2 moles, and more preferably 1.8 to 2.1 moles. Typically, as is indicated by Formula: $[(CH_3)_2HSiO_{1/2}]_8[SiO_{4/2}]_4$ or Formula: $[(CH_3)_2HSiO_{1/2}]_{10}[SiO_{4/2}]_5$, polymethylhydrogensiloxane having a structure in which 4 to 5 Q units and $M^H$ units are bonded or polymethylhydrogensiloxane having a structure in which 4 to 5 Q units, $M^H$ units, and M units (at least 3 $M^H$ units in a molecule) are bonded is especially preferable.

A compounding amount of the straight-chain or resinoid polyorganohydrogensiloxane being the component (C) is an effective amount for curing the above-described component (A) and component (B). Specifically, it is such an amount that a ratio of Si—H in the component (C) becomes 1.0 to 3.0 moles to the total 1 mole of the alkenyl groups in the component (A) and the alkenyl groups in the component (B). That is, a molar ratio of Si—H in the component (C) to the total of the alkenyl groups in the component (A) and the component (B) (the number of moles of Si—H/the number of moles of the alkenyl groups; hereinafter, referred to as "Si—H/alkenyl group") is within the range of 1.0 to 3.0. Si—H/alkenyl group is preferably within a range of 1.5 to 2.5. If Si—H/alkenyl group is less than 1.0, it may be difficult to obtain the cured product because a curing reaction does not progress, and if Si—H/alkenyl group is over 3.0, the physical properties of the cured product may change over time because a large amount of unreacted Si—H remains in the cured product.

Component (D)

The hydrosilylation reaction catalyst being the component (D) is a catalyst that promotes the addition reaction (hydrosilylation reaction) of the alkenyl groups in the component (A) and the component (B) with Si—H in the component (C). The hydrosilylation reaction catalyst is not limited as long as it promotes the hydrosilylation reaction.

A platinum-based metal compound is preferable, but a metal-based catalyst such as palladium, rhodium, cobalt, nickel, ruthenium, or iron is also usable. The platinum-based metal compound has a function of improving the flame retardancy of the composition. As the platinum-based metal compound, chloroplatinic acid, an alcohol solution of chloroplatinic acid, or a platinum complex having, as a ligand, olefines, vinyl group-containing siloxane, or an acetylene compound, or the like is usable, for instance.

The content of (D) the hydrosilylation reaction catalyst in the flame-retardant polyorganosiloxane composition of this embodiment is an amount with which it can promote the aforesaid hydrosilylation reaction (catalytic amount). In the case where (D) the hydrosilylation reaction catalyst is the platinum-based metal compound, its compounding amount is the catalytic amount, specifically, such an amount that its platinum element-equivalent content ratio to the whole composition becomes 0.5 to 10 mass ppm, more preferably 1 to 5 mass ppm, and still more preferably 1 to 3 mass ppm. If the compounding amount of the platinum-based metal compound is less than 0.5 mass ppm, curability becomes greatly low, and if the compounding amount is over 10 mass ppm, the cured product has low transparency. The compounding amount within this range makes it possible to obtain a cured product having excellent flame retardancy and good physical properties and is also economically advantageous.

The flame-retardant polyorganosiloxane composition of this embodiment is prepared through the uniform mixture of the above-described components. The flame-retardant polyorganosiloxane composition of this embodiment is characterized in that the total content of the phosphorus and the alkali metals is 20 mass ppm or less of the whole composition.

If the total content of the phosphorus and the alkali metals is over 20 mass ppm of the whole composition, the flame retardancy of the cured product varies. Further, the composition readily increases in viscosity to be poor in storage stability. In the case where the total content of the phosphorus and the alkali metals is 20 mass ppm or less of the whole composition, the cured product can have uniform and stable high flame retardancy. Further, the composition does not readily increase in viscosity to have good storage stability.

The total content of the phosphorus and the alkali metals in the composition of this embodiment is preferably 15 mass ppm or less, and most preferably, the composition contains substantially no phosphorus and alkali metals (less than 10 ppm).

To measure the contents of the phosphorus and the alkali metals in the composition of this embodiment, the same methods as those for measuring the contents of the phosphorus and the alkali metals in the component (B) can be used. That is, the contents of P and Cs can be measured by ICP-AES, the content of Cs by more sensitive ICP-MS, and the contents of K and Na by AAS.

An example of a method to adjust the content of the phosphorus and the alkali metals in the composition of this embodiment to the aforesaid range is to remove the phosphorus and the alkali metals in the component (B) by water washing, an ion exchange resin treatment, an adsorbent treatment, or the like of the component (B) as previously described. Besides, by removing the phosphorus and the alkali metals also in the component (A) by water washing, an ion exchange resin treatment, an adsorbent treatment, or the like, or by using the thermally decomposable polymerization catalyst for the synthesis of the component (A), it is possible to adjust the total content of the phosphorus and the alkali metals in the whole composition to 20 mass ppm or less of the whole composition.

A reaction inhibitor can be added to the flame-retardant polyorganosiloxane composition of this embodiment to adjust curability. Examples of the curing reaction inhibitor include: acetylene alcohols such as 3-methyl-1-butine-3-ol, 2-phenyl-3-butine-2-ol, and 1-ethynylcyclohexanol; and maleic acid derivatives such as diallyl maleate.

It is also possible to separate the composition into two solutions to prevent the progress of curing when it is stored, and then cause the curing by mixing the two liquids at the time of usage. In the two-liquid mixing type, considering the risk of a dehydrogenation reaction, it is necessary to avoid wrapping the polyorganohydrogensiloxane being the component (C) and the hydrosilylation reaction catalyst being the component (D) in the same package.

The viscosity of the flame-retardant polyorganosiloxane composition of this embodiment thus obtained is preferably within a range of 5,000 to 1,000,000 mPa·s, and especially preferably within a range of 10,000 to 500,000 mPa·s.

Preferably, the flame-retardant polyorganosiloxane composition of this embodiment does not contain an inorganic filler. Even from the composition not containing the inorganic filler, a cured product having sufficient rubber hardness and excellent flame retardancy can be obtained. Further, the cured product also has good mechanical properties (strength, elongation, and so on). The use of the flame-retardant polyorganosiloxane composition not containing the inorganic filler makes it possible to obtain a cured product having a high transmittance for light (for example, visible light).

The flame-retardant polyorganosiloxane composition of this embodiment can be cured by being heated as required. A curing condition is not limited, but it normally cures when kept at a temperature of 40 to 200° C., preferably 80 to 180° C., for 0.5 minutes to ten hours, preferably about one minute to six hours.

Flame-Retardant Cured Product

A flame-retardant cured product of the embodiment of this embodiment is produced through the curing of the above-described flame-retardant polyorganosiloxane composition. This cured product is excellent in flame retardancy. Specifically, an evaluation of the UL-94 flame retardancy of a specimen with a 6 mm thickness or less of the flame-retardant cured product of the embodiment is V-1 or V-0. Further, an evaluation of the UL-94 flame retardancy of a specimen with a 6 mm thickness or less of the flame-retardant cured product of the embodiment is 5 VB or 5 VA. Further, an evaluation of a specimen with a 6 mm thickness or less of the flame-retardant cured product of the embodiment in a UL-746C ultraviolet exposure and water immersion test is F1.

Further, this flame-retardant cured product has sufficient rubber hardness, good mechanical properties (strength, elongation), and good weather resistance, and undergoes less discoloring, for example, yellowing over time. Further, in a case where the flame-retardant polyorganosiloxane composition not containing the inorganic filler is used, this cured product has a high light transmittance, and for example, with a 6 mm thickness, it has an 85% transmittance or more for light with a 400 nm wavelength.

Incidentally, the flame-retardant polyorganosiloxane composition can be molded by a method selected from injection molding, compression molding, transfer molding, potting, and dispensing, among which the injection molding is especially preferable.

Optical Member

The flame-retardant cured product of the embodiment of this embodiment has excellent flame retardancy and good mechanical properties and weather resistance, undergoes less discoloring, for example, yellowing, and has a high light transmittance for visible light or the like and thus is usable as an optical member. The flame-retardant cured product of the embodiment is suitable as optical members such as a sealing material of a light-emitting element in a light-emitting device such as an LED device and a material of a functional lens.

The optical member can be suitably used as lenses or covers of various kinds of indoor or outdoor light sources and automobile light sources. Examples of the light source include indoor or outdoor lighting, a reading light and accent lighting of public transportation, and an LED street light.

More specific examples of the optical member include a primary or secondary LED lens, a thick optical lens, an LED reflector, an automobile LED matrix lighting lens, an optical member for augmented reality, a silicone optical head for LED chips, a lens and a reflector for work lights, a lighting optical member for smartphones or tablets, and an LED display for computers or television, and a light guide.

EXAMPLES

Hereinafter, the present invention will be specifically described along with examples, but the present invention is not limited to these examples.

In the description below, an M unit, an $M^{vi}$ unit, a $D^H$ unit, and a Q unit represent siloxane units represented by the following formulas respectively.

M unit $(CH_3)_3SiO_{1/2}$ $M^{vi}$ unit $(CH_3)_2(CH_2=CH)SiO_{1/2}$ $D^H$ $(CH_3)HSiO_{2/2}$ Q unit $SiO_{4/2}$ In the following, viscosity is a viscosity that is measured at 25° C. using a rotational viscometer in conformity with JIS K6249. Further, a mass average molecular weight (Mw) is a polystyrene-equivalent value measured with a gel permeation chromatography (GPC) device (manufactured by SHIMADZU Corporation, device name; Prominence GPC system, column; Shim-pack GPC-80M) using toluene as a solvent. A nonvolatile content (mass %) is a value measured under a heating condition of 150° C.×1 hour. Further, the content of P was measured by ICP-AES, the content of CS by ICP-MS, and the contents of Na and K by AAS.

Synthesis Example 1 (Synthesis of Straight-Chain Polydimethylsiloxane Containing Vinyl Groups at Both Ends A1)

Straight-chain dimethylpolysiloxane A1 with its chain ends terminated with dimethylvinylsiloxy groups was synthesized by a known method using tetramethylammonium silanolate as a catalyst.

The obtained straight-chain polydimethylsiloxane A1 had a viscosity of 80 Pa·s and a vinyl group content of 0.03 mmol/g (the average number of the vinyl groups in one molecule; 2). Further, the contents of P, Cs, K, and Na in the polydimethylsiloxane A1 were measured but none of them was detected.

Synthesis Example 2 (Synthesis of Straight-Chain Polydimethylsiloxane Containing Vinyl Group at Both Ends A2)

Straight-chain dimethylpolysiloxane A2 with its chain ends terminated with dimethylvinylsiloxy groups was synthesized by a known method using cesium hydroxide as a catalyst.

The obtained polydimethylsiloxane A2 had a viscosity of 60 Pa·s and a vinyl group content of 0.04 mmol/g (the average number of the vinyl groups in one molecule; 2). Further, when the contents of P, Cs, K, and Na in the polydimethylsiloxane A2 were measured, none of P, K, and Na was detected but the content of Cs was 9 mass ppm.

Synthesis Example 3 (Synthesis of Vinyl Group-Containing Resinoid Polysiloxane B1)

970 g of tetraethoxysilane, 70 g of chlorodimethylvinylsilane, 335 g of chlorotrimethylsilane, and 400 g of xylene were put into a flask, followed by stirring, and 900 g of a mixed solution of 600 g of water and 300 g of acetone was dropped therein. After the resultant solution was stirred at 70 to 80° C. for one hour to cause hydrolysis, the solution was separated, whereby a xylene solution was obtained. Next, 500 g of water was added to the obtained xylene solution, and water washing and liquid separation were performed, and the acetone in the xylene solution was extracted into the water. Then, the operation of the water washing and the liquid separation was repeated until the water used for the washing became neutral.

Next, 200 g of xylene and 0.18 g of potassium hydroxide were added to the obtained xylene solution, followed by stirring along with heating. The resultant was heated up to 140° C., followed by 140° C. and three-hour reflux. After cooled, the resultant was neutralized using phosphoric acid, and a nonvolatile content was adjusted to 50 mass %, whereby a xylene solution of a vinyl group-containing resinoid polysiloxane B0 was obtained.

From the prepared amounts of the starting materials, it is seen that the obtained vinyl group-containing resinoid polysiloxane B0 has an $M^{vi}$ unit, an M unit, and a Q unit, and a molar ratio of these units is as follows: $M^{vi}$ unit:the M unit:the Q unit=0.07:0.37:0.56. Further, the content of the vinyl groups was 1 mmol/g (the average number of the vinyl groups in one molecule; 2.8), and Mw of the vinyl group-containing resinoid polysiloxane B0 found by GPC was 2840.

Next, the xylene solution of the vinyl group-containing resinoid polysiloxane B0 obtained above was water-washed twice. Specifically, water was added to the xylene solution of the vinyl group-containing resinoid polysiloxane B0 and the solution was separated, and thereafter the solution was heated up to 140° C. and the residual water was removed. Thereafter, a nonvolatile content was adjusted to 50 mass %, whereby a xylene solution of a vinyl group-containing resinoid polysiloxane B1 was obtained.

The content of P in the obtained resinoid polysiloxane B1 was less than 10 mass ppm, that is, P was not detected, the content of K was 0.6 mass ppm, and neither of Na and Cs was detected.

Synthesis Example 4 (Synthesis of Vinyl Group-Containing Resinoid Polysiloxane B2)

The xylene solution of the vinyl group-containing resinoid polysiloxane B0 obtained in Synthesis Example 3 was water-washed once. Specifically, water was added to the xylene solution of the vinyl group-containing resinoid polysiloxane B0, and the solution was washed and separated, thereafter it was heated to 140° C., and the residual water was removed. Then, a nonvolatile content was adjusted to 50 mass %, whereby a xylene solution of a vinyl group-containing resinoid polysiloxane B2 was obtained.

In the obtained resinoid polysiloxane B2, the content of P was 17 mass ppm, the content of K was 1.2 mass ppm, and neither of Na and Cs was detected.

Synthesis Example 5 (Synthesis of Vinyl Group-Containing Resinoid Polysiloxane B3)

As a vinyl group-containing resinoid polysiloxane B3, the xylene solution of the vinyl group-containing resinoid polysiloxane B0 obtained in Synthesis Example 3 was used as it was without being water-washed.

In the obtained resinoid polysiloxane B3, the content of P was 40 ppm by mass, the content of K was 7 mass ppm, and neither of Na and Cs was detected.

Table 1 shows the contents of alkali metals and P in the straight-chain polydimethylsiloxanes A1, A2 containing vinyl groups at both ends and the resinoid polysiloxanes B1 to B3 which are obtained above. Since the limit of Cs detection sensitivity is on a ppb order, "0" is entered if it was not detected. For the other elements, a value indicating less than the detection sensitivity limit is entered in the table. In Table 1, if any of the alkali metals was not detected, "<0.4" is entered as the total content of the alkali metals. That is, "<0.4" in the total content of the alkali metals corresponds to substantially zero.

hours. Next, after the reaction solution was filtered to be deprived of the activated clay, the reaction solution was increased in temperature up to 140° C. under a reduced pressure of 5 mmHg or less and thereafter heated and stirred at 140 to 150° C. for six hours.

A content ratio of Si—H in the straight-chain polymethylhydrogensiloxane C1 thus obtained was 7.6 mmol/g.

Synthesis Example 7 (Synthesis of Resinoid Polymethylhydrogensiloxane C2)

500 g of toluene, 830 g of tetraethoxysilane, and 760 g of dimethylchlorosilane were uniformly dissolved. While being stirred, the mixture was dropped into excessive water put in a reaction container including a stirrer, a dropping device, a heating/cooling device, and a pressure reducing device, and was cohydrolyzed and condensed at room temperature while heat of solution of by-produced hydrochloric acid was removed by cooling. Next, an obtained organic layer was water-washed until washing water became neutral, followed by dehydration, and thereafter, the toluene and by-produced tetramethyldisiloxane were distilled under 100° C./667 Pa (5 mm Hg), whereby liquid polymethylhydrogensiloxane was obtained. Next, the obtained polymethylhydrogensiloxane was further heated under 150° C./667 Pa (5 mmHg), whereby a low-molecular weight substance having a low boiling point was removed.

A content ratio of Si—H in the resinoid polymethylhydrogensiloxane C2 thus obtained was 10.0 mmol/g.

Example 1

50 parts by mass (hereinafter, simply referred to as part) of the straight-chain polydimethylsiloxane A1 containing vinyl groups at both ends (80 Pa·s viscosity) obtained in Synthesis Example 1 and 100 parts of the xylene solution (50 mass %) of the vinyl group-containing resinoid polysiloxane B1 obtained in Synthesis Example 3 were mixed (a mass ratio in the mixture in terms of the nonvolatile contents: (A1):(B1)=50:50) and the xylene was removed by heating to 150° C. under a reduced pressure condition.

A polyorganosiloxane composition was prepared by mixing 100 parts of a vinyl group-containing polymer mixture (1) thus obtained, 12.2 parts of the straight-chain polymethylhydrogensiloxane C1 obtained in Synthesis Example 6 (a molar ratio of Si—H in the component C1 to the vinyl groups in the vinyl group-containing polymer mixture (1)

TABLE 1

| | | | | Content [mass ppm] | | | | | |
|---|---|---|---|---|---|---|---|---|---|
| Component | Polymer | Viscosity or Mw | Number of Vi groups | Cs | K | Na | Total of alkali metals | P | Total of alkali metals and P |
| (A) | Straight-chain polydimethylsiloxane containing vinyl groups at both ends A1 | Viscosity 80 Pa·s | 2 | 0 | <0.4 | <0.4 | <0.4 | <10 | — |
| | Straight-chain polydimethylsiloxane containing vinyl groups at both ends A2 | Viscosity 60 Pa·s | 2 | 9 | <0.4 | <0.4 | 9 | <10 | — |
| (B) | Vinyl group-containing resinoid polysiloxane B1 | Mw 2840 | 2.8 | 0 | 0.6 | <0.4 | 0.6 | <10 | — |
| | Vinyl group-containing resinoid polysiloxane B2 | Mw 2840 | 2.8 | 0 | 1.2 | <0.4 | 1.2 | 17 | 18 |
| | Vinyl group-containing resinoid polysiloxane B3 | Mw 2840 | 2.8 | 0 | 7 | <0.4 | 7 | 40 | 47 |

Synthesis Example 6 (Synthesis of Straight-Chain Polymethylhydrogensiloxane C1)

1390 g of polymethylhydrogensiloxane represented by Average Formula: $MD^H{}_{50}M$ and 1406 g of octamethylcyclotetrasiloxane were put into a flask together with 25 g of activated clay, followed by stirring, and they were made to undergo an equilibration reaction at 50 to 70° C. for six (H/Vi)=1.8), and (D) a platinum complex solution as a Pt component having tetramethyltetravinylcyclotetrasiloxane as a ligand, an amount of the Pt component being 3 ppm of the whole composition.

Examples 2 to 5, Comparative Examples 1 to 3

The straight-chain polydimethylsiloxane A1 or A2 containing vinyl groups at both ends obtained in Synthesis Example 1 or 2, one of the vinyl group-containing resinoid polysiloxanes B1 to B3 obtained in Synthesis Examples 3 to 5, the polymethylhydrogensiloxane C1 or C2 obtained in Synthesis Example 6 or 7, and (D) the platinum complex solution having tetramethyltetravinylcyclotetrasiloxane as a ligand were mixed as in Example 1 such that their ratios became those shown in Table 2, whereby each polyorganosiloxane composition was prepared.

Regarding the polyorganosiloxane compositions thus obtained in Examples 1 to 5 and Comparative Examples 1 to 3, the content of P and the content of Na, K, and Cs as the alkali metals were measured. Table 2 shows the contents (mass ppm) of P and the alkali metals and the total content (mass ppm) of these. Further, the flame retardancy of each cured product was measured and evaluated as follows. Table 2 shows the results.

A notation method of the contents of the alkali metals and P in Table 2 is the same as in Table 1. As for the total content of the alkali metals and P, the non-detection of any of the alkali metals and P is indicated by "<10". Further, regarding Example 5, the content of the alkali metals was rounded off to the nearest whole number, that is, to "0 ppm", and the total of the content of the alkali metals and the content of P "<10" is indicated as "<10", that is, less than 10 ppm.

Flame Retardancy

The polyorganosiloxane compositions obtained in Examples 1 to 5 and Comparative Examples 1 to 3 were heated at 130° C. for fifteen minutes to be cured, whereby sheets each having the thickness shown in Table 2 were fabricated, and a flame retardancy test conforming to UL-94 V was conducted. Specifically, the obtained sheets were cut into the size conforming to UL-94, whereby specimens were fabricated, and the specimens were subjected to the flame retardancy test. Table 2 shows the results of the flame retardancy test. Table 2 shows the maximum value of the combustion time (longest combustion time), the total combustion time, and the evaluation results of flame retardancy. In the evaluation of flame retardancy, V-0 level and V-1 level are entered as they are, and x was entered for other evaluations.

The shorter the longest combustion time and the total combustion time, the higher the flame retardancy stability. Further, with the same longest combustion time or total combustion time, the thinner the sample, the higher the flame retardancy stability.

Storage Stability

Regarding the composition obtained in Example 1 and the composition obtained in Comparative Example 1 (excluding the component (D)), an initial viscosity and a viscosity after 70° C. and fourteen-day aging were measured, and a rate of change in the viscosity was found. Table 3 shows the results.

TABLE 2

| | | | Example 1 | Example 2 | Example 3 | Example 4 | Example 5 |
|---|---|---|---|---|---|---|---|
| Composition (part by mass) | (A) | Straight-chain polydimethylsiloxane containing vinyl groups at both ends A1 (viscosity 80 Pa · s) | 50 | 60 | 60 | 65 | 60 |
| | | Straight-chain polydimethylsiloxane containing vinyl groups at both ends A2 (viscosity 60 Pa · s) | | | | | |
| | (B) | Vinyl group-containing resinoid polysiloxane B1 | 50 | 40 | 40 | 35 | |
| | | Vinyl group-containing resinoid polysiloxane B2 | | | | | 40 |
| | | Vinyl group-containing resinoid polysiloxane B3 | | | | | |
| | (C) | SiH-containing straight-chain polysiloxane C1 SiH 7.6 mmol/g | 12.2 | | | | |
| | | SiH-containing resinoid polysiloxane C2 SiH 10.0 mmol/g | | 8.4 | 8.4 | 7.4 | 8.4 |
| | (D) | Pt-based catalyst (as Pt component) (ppm) | 3 | 3 | 3 | 3 | 3 |
| Si—H/Vi molar ratio (Si—H in component (C)/Vi in components (A), (B)) | | | 1.8 | 2.0 | 2.0 | 2.0 | 2.0 |
| Contents of phosphorus and alkali metals | | Content of phosphorus (mass ppm) | <10 | <10 | <10 | <10 | <10 |
| | | Total content of alkali metals (mass ppm) | <0.4 | <0.4 | <0.4 | <0.4 | 0.4 |
| | | Total content of phosphorus and alkali metals (mass ppm) | <10 | <10 | <10 | <10 | <10 |
| Evaluation | Flame retardancy | Thickness of specimen (mm) | 5 | 5 | 3 | 5 | 5 |
| | | Longest combustion time (second) | 9 | 7 | 21 | 6 | 11 |
| | | Total combustion time (second) | 49 | 32 | 137 | 22 | 53 |
| | | Evaluation of UL-94 V combustion test | V-0 | V-0 | V-1 | V-0 | V-1 |

| | | | Comparative example 1 | Comparative example 2 | Comparative example 3 |
|---|---|---|---|---|---|
| Composition (part by mass) | (A) | Straight-chain polydimethylsiloxane containing vinyl groups at both ends A1 (viscosity 80 Pa · s) | | | |
| | | Straight-chain polydimethylsiloxane containing vinyl groups at both ends A2 (viscosity 60 Pa · s) | 50 | 60 | 65 |
| | (B) | Vinyl group-containing resinoid polysiloxane B1 | | | |
| | | Vinyl group-containing resinoid polysiloxane B2 | | | |
| | | Vinyl group-containing resinoid polysiloxane B3 | 50 | 40 | 35 |
| | (C) | SiH-containing straight-chain polysiloxane C1 SiH 7.6 mmol/g | 12.3 | | |
| | | SiH-containing resinoid polysiloxane C2 SiH 10.0 mmol/g | | 8.5 | 7.5 |
| | (D) | Pt-based catalyst (as Pt component) (ppm) | 3 | 3 | 3 |

TABLE 2-continued

| | | | | |
|---|---|---|---|---|
| Si—H/Vi molar ratio (Si—H in component (C)/Vi in components (A), (B)) | | 1.8 | 2.0 | 2.0 |
| Contents of phosphorus and alkali metals | Content of phosphorus (mass ppm) | 18 | 15 | 13 |
| | Total content of alkali metals (mass ppm) | 7 | 8 | 8 |
| | Total content of phosphorus and alkali metals (mass ppm) | 25 | 23 | 21 |
| Evaluation | Flame retardancy Thickness of specimen (mm) | 6 | 6 | 6 |
| | Longest combustion time (second) | 52 | 63 | 40 |
| | Total combustion time (second) | 281 | 259 | 241 |
| | Evaluation of UL-94 V combustion test | x | x | x |

TABLE 3

| | Example 1 | Comparative example 1 |
|---|---|---|
| Total content of phosphorus and alkali metals (mass ppm) | <10 | 25 |
| Rate of change in viscosity due to 70° C. × 14 days aging (%) | 0.8 | 21 |

The following is seen from the measurement results in Table 2. That is, the cured products of the polyorganosiloxane compositions of Examples 1 to 5 in which the components (A) to (D) prescribed in this embodiment are compounded with the predetermined compositions and the total content of the phosphorus and the alkali metals is adjusted to 20 mass ppm or less exhibit high flame retardancy, and the evaluation of their UL-94 V flame retardancy is V-0 or V1 level. Further, their longest combustion time and total combustion time are short, and thus they exhibit stable flame retardancy.

On the other hand, in the polyorganosiloxane compositions of Comparative Examples 1 to 3, since the total content of the phosphorus and the alkali metals is over 20 mass ppm of the whole composition, their cured products do not have good flame retardancy, specifically, their UL-94 V flame retardancy does not reach V-1 level. Further, their longest combustion time and total combustion time are far longer than those of Examples having a similar composition.

Further, it is seen from the measurement results in Table 3 that the polyorganosiloxane composition (excluding the component (D)) of Example 1 in which the total content of the phosphorus and the alkali metals is adjusted to 20 mass ppm or less is excellent in storage stability because its rate of change in viscosity after the aging is far smaller than that of the composition (excluding the component (D)) of Comparative Example 1 in which the total content is over 20 mass ppm.

According to the flame-retardant polyorganosiloxane composition of this embodiment, it is possible to obtain a cured product having good mechanical properties and excellent flame retardancy. Having excellent flame retardancy stability and not readily changing in viscosity over time, the composition is high in storage stability. Therefore, a flame-retardant cured product produced through the curing of this composition is suitable as optical members such as a sealing material of a light-emitting element in a light-emitting device such as an LED device, and a functional lens, for instance. It can be suitably used in particular as lenses and covers of outdoor light sources and automobile light sources.

What is claimed is:

1. A flame-retardant polyorganosiloxane composition comprising:
   (A) a straight-chain polyorganosiloxane represented by general formula:

[Chem. 1]

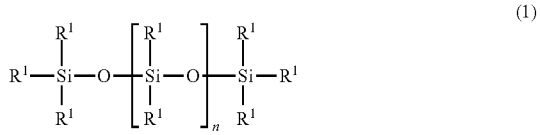

(1)

wherein $R^1$s represent an alkenyl group or a substituted or unsubstituted alkyl group, n represents the number of repeating units, and a sum of n and the number of end groups (n+2) defines an average polymerization degree, the straight-chain polyorganosiloxane having two or more alkenyl groups bonded to silicon atoms on average in one molecule and having a viscosity at 25° C. of 80,000 to 1,000,000 mPa s;

(B) 30 to 80 mass % of a polyorganosiloxane having a resin structure to a total of the component (A) and the component (B), the polyorganosiloxane having 1.5 or more alkenyl groups bonded to silicon atoms on average in one molecule, wherein the component (B) comprises at least one selected from the group consisting of phosphorus and an alkali metal, wherein the component (B) comprises potassium as the alkali metal, a content ratio of all alkali metals in the component (B) is 0.6 ppm by mass or more, and the polyorganosiloxane comprises:
   a monofunctional siloxane unit represented by a formula: $(CH_3)_2(CH_2=CH) SiO_{1/2}$;
   a monofunctional siloxane unit represented by a formula: $(CH_3)_3SiO_{1/2}$; and
   a tetrafunctional siloxane unit represented by a formula: $SiO_{4/2}$;

(C) a polyorganohydrogensiloxane having three or more hydrogen atoms bonded to silicon atoms on average in one molecule, wherein an amount of the hydrogen atoms bonded to the silicon atoms in the component (C) becomes 1.0 to 3.0 mol to a total 1 mol of the alkenyl groups in the component (A) and the alkenyl groups in the component (B); and (D) a catalytic amount of a hydrosilylation reaction catalyst, wherein a total content of phosphorus and an alkali metal is 10 mass ppm or less, and a total content of all alkali metals in the flame-retardant polyorganosiloxane composition is less than 0.4 mass ppm.

2. The flame-retardant polyorganosiloxane composition according to claim 1, wherein the component (A) is synthesized using a thermally decomposable polymerization catalyst.

3. The flame-retardant polyorganosiloxane composition according to claim 1, wherein the component (A) contains substantially no alkali metal.

4. The flame-retardant polyorganosiloxane composition according to claim 1, wherein a total content of phosphorus and an alkali metal in the component (B) is 30 mass ppm or less of the component (B).

5. The flame-retardant polyorganosiloxane composition according to claim 4, wherein a content ratio of the phosphorus in the component (B) to the component (B) is 25 mass ppm or less.

6. The flame-retardant polyorganosiloxane composition according to claim 1, the flame-retardant polyorganosiloxane composition not containing an inorganic filler, and a cured product with a 6 mm thickness of the flame-retardant polyorganosiloxane composition having an 85% transmittance or higher for light with a 400 nm wavelength.

7. A flame-retardant cured product produced through curing of the flame-retardant polyorganosiloxane composition according to claim 1, wherein an evaluation of UL-94 flame retardancy of a specimen with a 6 mm thickness or less of the flame-retardant cured product is V-1 or V-0.

8. A flame-retardant cured product produced through curing of the flame-retardant polyorganosiloxane composition according to claim 1, wherein an evaluation of UL-94 flame retardancy of a specimen with a 6 mm thickness or less of the flame-retardant cured product is 5VB or 5VA.

9. A flame-retardant cured product produced through curing of the flame-retardant polyorganosiloxane composition according to claim 1, wherein an evaluation of a specimen with a 6 mm thickness or less of the flame-retardant cured product in a UL-746C ultraviolet exposure and water immersion test is F1.

10. An optical member produced through curing of the flame-retardant polyorganosiloxane composition according to claim 1.

11. The optical member according to claim 10, the optical member being a lens for a light source or a cover for a light source.

12. The optical member according to claim 11, wherein the light source is at least one selected from indoor or outdoor lighting, a reading light and accent lighting of public transportation, and an LED street light.

13. The optical member according to claim 10, the optical member being at least one selected from a primary or secondary LED lens, a thick optical lens, an LED reflector, an automobile LED matrix lighting lens, an optical member for augmented reality, a silicone optical head for an LED chip, a lens and a reflector for a work light, a lighting optical member for a smartphone or a tablet, an LED display for a computer or television, and a light guide.

* * * * *